(12) United States Patent
Hosokawa et al.

(10) Patent No.: US 7,132,755 B2
(45) Date of Patent: Nov. 7, 2006

(54) ADHESIVE FILM FOR MANUFACTURING SEMICONDUCTOR DEVICE

(75) Inventors: Kazuhito Hosokawa, Ibaraki (JP); Takuji Okeyui, Ibaraki (JP); Kazuhiro Ikemura, Ibaraki (JP); Keisuke Yoshikawa, Ibaraki (JP)

(73) Assignee: Nitto Denko Corporation, Ibaraki (JP)

( * ) Notice: Subject to any disclaimer, the term of this patent is extended or adjusted under 35 U.S.C. 154(b) by 49 days.

(21) Appl. No.: 11/012,126

(22) Filed: Dec. 16, 2004

(65) Prior Publication Data
US 2005/0133936 A1  Jun. 23, 2005

(30) Foreign Application Priority Data
Dec. 19, 2003  (JP) .............................. 2003-423658

(51) Int. Cl.
*H01L 23/48* (2006.01)
(52) U.S. Cl. .............. 257/783; 257/782; 257/789; 257/785; 257/784; 257/666; 257/787; 257/678
(58) Field of Classification Search .............. 257/783, 257/782, 789, 785, 784, 666, 787, 678
See application file for complete search history.

(56) References Cited
U.S. PATENT DOCUMENTS
5,900,676 A * 5/1999 Kweon et al. .............. 257/787
6,404,643 B1 * 6/2002 Chung .............. 361/737
2003/0190466 A1 * 10/2003 Nakaba et al. .............. 428/344

FOREIGN PATENT DOCUMENTS
JP  09-252014 A  9/1997
JP  2000-294580 A  10/2000

* cited by examiner

*Primary Examiner*—Eddie C. Lee
*Assistant Examiner*—Junghwa Im
(74) *Attorney, Agent, or Firm*—Birch, Stewart, Kolasch & Birch, LLP

(57) ABSTRACT

An adhesive film for manufacturing a semiconductor device comprising a thermosetting adhesive layer and a heat-resistant backing layer, wherein the adhesive film is applied to a method for manufacturing a semiconductor device, comprising the steps of (a) embedding at least a part of a conductor in the adhesive film to form a conductor adhered thereto; (b) mounting a semiconductor chip on the conductor; (c) connecting the semiconductor chip to the conductor; (d) encapsulating the semiconductor chip with an encapsulation resin; and (e) removing the adhesive film therefrom. The adhesive film can be suitably used for manufacturing a semiconductor device having a so-called standoff wherein a part of a conductor is projecting from an encapsulation resin.

9 Claims, 2 Drawing Sheets (a)

(b)

(c)

(d)

(e)

ADHESIVE FILM FOR MANUFACTURING SEMICONDUCTOR DEVICE

BACKGROUND OF THE INVENTION

1. Field of the Invention

The present invention relates to an adhesive film for manufacturing a semiconductor device, and a method for manufacturing a semiconductor device.

2. Discussion of the Related Art

In recent years, CSP (Chip Size/Scale Package) technique has been remarked in LSI (Large Scale IC) mounting technology. In CSP technique, a package having lead terminals inside thereof, as represented by a QFN (Quad Flat Non-leaded package), is one of package forms that are especially remarked, from the viewpoint of miniaturization and high integration. Among the methods for manufacturing QFN described above, recently, there has especially been remarked a method for dramatically improving productivity per area of a lead frame, by systematically arranging plural chips for a QFN on die pads in package pattern regions of a lead frame, simultaneously encapsulating with an encapsulation resin in cavities of a mold, and thereafter cutting the lead frame into individual QFN structures by dicing.

In the method for manufacturing QFN in which plural semiconductor chips are simultaneously encapsulated, an outer side of a resin encapsulation region extending outwardly from the package pattern region is only clamped by the mold die during the resin encapsulation. Therefore, in the package pattern region, especially in the central portion thereof, since the outer lead surface cannot be pressed with a sufficient pressure to the mold die, it is very difficult to prevent leakage of the encapsulation resin to the outer lead side, and as a result, a problem of coating the terminals of the QFN with the resin is likely to be caused.

In view of the above, in the method for manufacturing a QFN, there has been proposed a method for preventing leakage of an encapsulation resin to an outer side, comprising adhering an adhesive tape to an outer pad surface of the lead frame, thereby giving a sealing effect by masking the outer pad surface of the lead frame with the adhesive tape (see Japanese Patent Laid-Open No. 2000-294580). In this method, the adhesive tape is adhered together to the outer pad surface of the lead frame in the beginning of the manufacturing steps, and thereafter being adhered together during a semiconductor chip mounting step, and a wire bonding step, up to an encapsulating step with an encapsulation resin.

Further, in recent years, there has also been proposed a method for manufacturing a so-called leadless semiconductor device in which the semiconductor is formed by adhering together a copper foil to a backing and etching the conductor (see Japanese Patent Laid-Open No. Hei 9-252014) for the purpose of further thinning of the semiconductor device. According to this method, since the conductor is formed on a backing, the conductor can be made thinner. Also, there is little abrasion of a blade during dicing, since it is not necessary to cut the lead frame when obtaining individual semiconductor devices molded with an encapsulation resin.

It is necessary that the adhesive tape and the backing to be used in the above-mentioned methods not only prevent leakage of an encapsulation resin but also have properties which meet the requirement, such as having high heat resistance sufficient to withstand high temperatures in a semiconductor chip mounting step; not interfering with delicate operability in the wire bonding step; and allowing the adhesive to be well stripped away without remaining on an adherend after the termination of the encapsulation step.

In view of the above, in the method for manufacturing a semiconductor device, a silicone-based adhesive having excellent heat resistance and appropriate elastic modulus and adhesive strength has been generally used in the adhesive layer of the adhesive film which is to be finally stripped away.

However, since the silicone-based adhesive used in a heat-resistant adhesive tape is cross-linked in a high degree for the purpose of increasing heat resistance, the adhesive has a high elastic modulus and poor fluidity. Therefore, in the case of manufacturing a semiconductor device having a so-called standoff wherein a part of a conductor projects from an encapsulation resin, the silicone-based adhesive has a disadvantage that it is difficult to allow a part of the conductor to be embedded in the adhesive layer in the manufacturing step.

An object of the present invention is to provide an adhesive film for manufacturing a semiconductor device which is to be finally removed in the method, which can be suitably used in the manufacture of a semiconductor device having a so-called standoff wherein a part of a conductor projects from an encapsulation resin.

These and other objects of the present invention will be apparent from the following description.

SUMMARY OF THE INVENTION

According to the present invention, there are provided:

(1) an adhesive film for manufacturing a semiconductor device comprising a thermosetting adhesive layer and a heat-resistant backing layer, wherein the adhesive film is applied to a method for manufacturing a semiconductor device comprising the steps of:

(a) embedding at least a part of a conductor in the adhesive film to form a conductor adhered thereto;
(b) mounting a semiconductor chip on the conductor;
(c) connecting the semiconductor chip to the conductor;
(d) encapsulating the semiconductor chip with an encapsulation resin; and
(e) removing the adhesive film therefrom; and (2) a method for manufacturing a semiconductor device comprising the steps of:

(a) embedding at least a part of a conductor in an adhesive film to form a conductor adhered thereto;
(b) mounting a semiconductor chip on the conductor;
(c) connecting the semiconductor chip to the conductor;
(d) encapsulating the semiconductor chip with an encapsulation resin; and
(e) removing the adhesive film therefrom, wherein the adhesive film comprises a thermosetting adhesive layer and a heat-resistant backing layer.

By using the adhesive film of the present invention, a semiconductor device with a standoff, the semiconductor having high mounting reliability can be stably manufactured.

Figure 1:
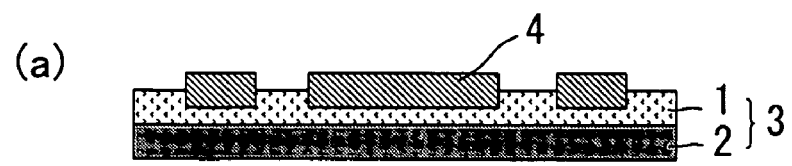
FIG. 1 is a schematic view showing one embodiment of the method for manufacturing a semiconductor device using the adhesive film of the present invention.
Figure 1:
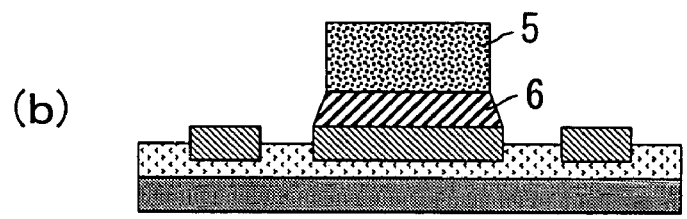
Figure 1:
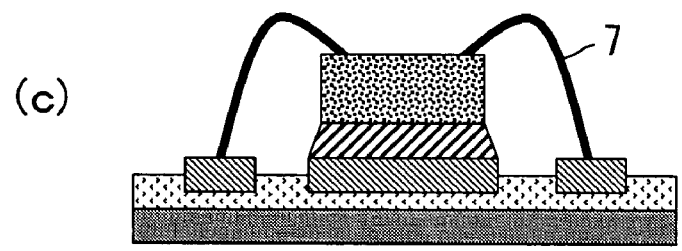
Figure 1:
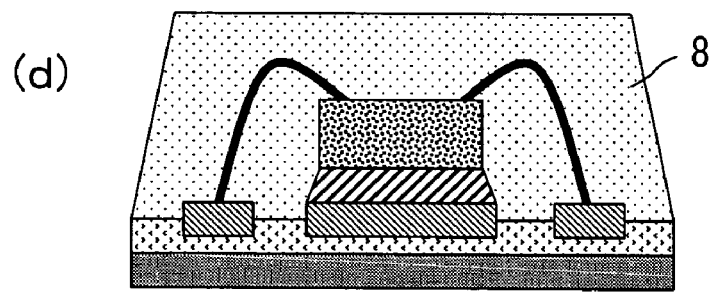
Figure 1:
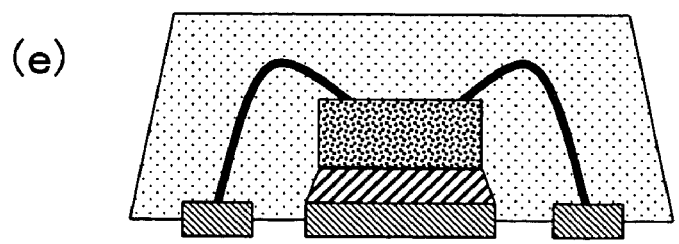
Figure 2:
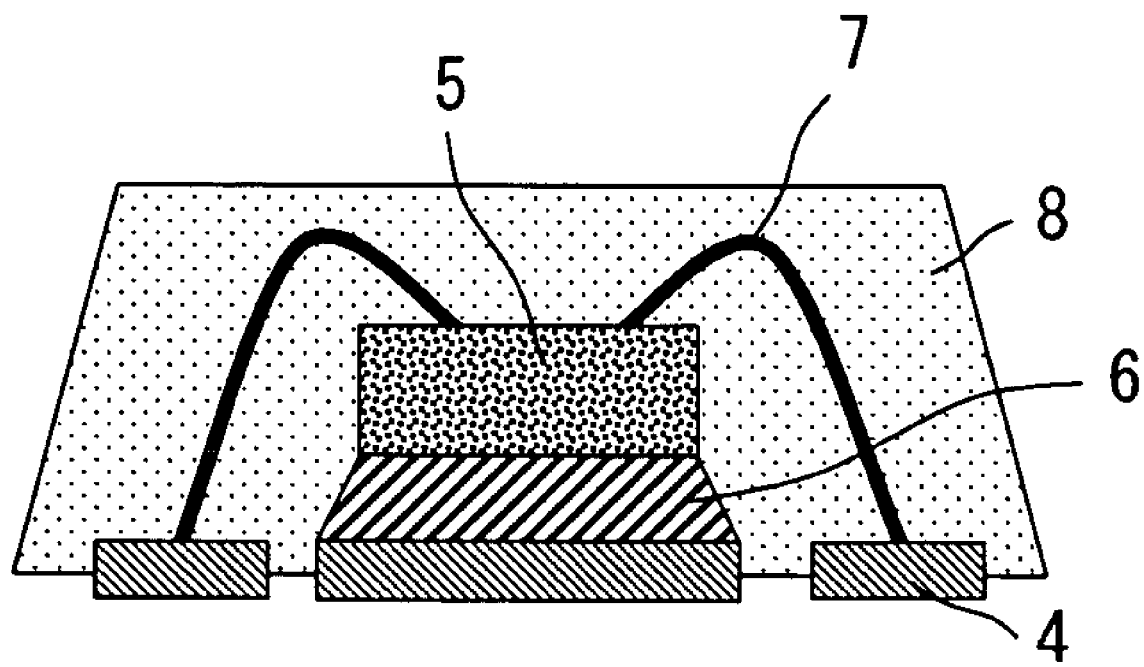
FIG. 2 is a cross-sectional view showing one embodiment of a semiconductor device obtainable with the adhesive film of the present invention.

Reference numerals in FIGS. 1 and 2 are as follows.

1 is a thermosetting adhesive layer, 2 is a heat-resistant backing layer, 3 is an adhesive film, 4 is a conductor, 5 is a semiconductor chip, 6 is an adhesive, 7 is a wire, and 8 is an encapsulation resin.

DETAILED DESCRIPTION OF THE INVENTION

The adhesive film of the present invention comprises a thermosetting adhesive layer and a heat-resistant backing layer.

The adhesive contained in the thermosetting adhesive layer includes various pressure-sensitive adhesives such as silicone-based pressure-sensitive adhesives and acrylic pressure-sensitive adhesives, and various adhesives such as epoxy/rubber-based adhesives and polyimide-based adhesives. Among them, epoxy/rubber-based thermosetting adhesives containing epoxy resins and rubber components are preferably used from the viewpoint of heat resistance and adhesion.

As the epoxy resin, a compound having two or more epoxy groups in one molecule is preferable. The epoxy resin includes glycidylamine epoxy resins, bisphenol F epoxy resins, bisphenol A epoxy resins, phenol novolak epoxy resins, cresol novolak epoxy resins, biphenyl epoxy resins, naphthalene epoxy resins, aliphatic epoxy resins, alicyclic epoxy resins, heterocyclic epoxy resins, spiro ring-containing epoxy resins, halogenated epoxy resins and the like. These epoxy resins can be used alone or in admixture of two or more kinds.

The content of the epoxy resin in the adhesive is preferably from 40 to 95% by weight, more preferably from 60 to 80% by weight, from the viewpoint of heat resistance and flexibility.

The epoxy equivalent of the epoxy resin is preferably 1000 g/eq or less, more preferably 650 g/eq or less, from the viewpoint of preventing the adhesive from remaining on an adherend after stripping away of the adhesive film.

The rubber components includes those conventionally used for epoxy-based adhesives, such as NBR (acrylonitrile-butadiene rubber) and acrylic rubber. Among them, a copolymerized rubber containing an acrylonitrile moiety in a ratio of 5% by weight or more is preferable, and more preferably a carboxyl group modified-rubber, from the viewpoint of easy stripping away of the adhesive film after molding of an encapsulation resin. The rubber includes an acrylonitrile-butadiene rubber such as "Nipol 1072J" (commercially available from ZEON CORPORATION) and an acrylic rubber such as "PARACRON ME2000" (commercially available from Negami Chemical Industrial Co., Ltd.). Here, the copolymerization ratio of acrylonitrile is preferably from 5 to 30% by weight, more preferably from 5 to 20% by weight.

The content of the rubber component in the adhesive is preferably from 5 to 40% by weight, more preferably from 5 to 30% by weight, from the viewpoint of flexibility and heat resistance.

Further, it is preferable that the adhesive contains a curing agent for curing the epoxy resin, that is a curing component. The curing agent includes phenol resins, various imidazole-based compounds and derivatives thereof, hydrazide compounds, dicyandiamide, microcapsulated products thereof and the like. For instance, in a case where a phenol resin is contained as a curing agent, a phosphorus-based compound such as triphenylphosphine, or the like may also be used together as a curing accelerator.

Although the content of the curing agent in the adhesive cannot be necessarily set to a specific value because the content varies depending on the kinds thereof. In a case where a phenol resin is used as the curing agent, it is preferable that the phenol resin is contained in an amount equivalent to the epoxy resin. As to each of the contents of the other curing agent and the curing accelerator, the content is preferably from 0.05 to 5 parts by weight, more preferably from 0.1 to 3 parts by weight based on 100 parts by weight of the epoxy resin.

Furthermore, the thermosetting adhesive layer may contain known various additives such as inorganic fillers, organic fillers, pigments, age resisters (antioxidants), silane coupling agents, and tackifying agents within the range in which various properties of the adhesive film would not be deteriorated. Among these additives, age resisters are effective for preventing deterioration at high temperatures.

The thickness of the thermosetting adhesive layer is preferably from about 1 to about 50 µm, more preferably from about 5 to about 30 µm, from the viewpoint of film-forming property.

In the present invention, it is preferable that the thermosetting adhesive layer has specified elasticity. Specifically, when the thermosetting adhesive layer is used for manufacturing a semiconductor device, in the step (a) described below, the thermosetting adhesive layer preferably has a low viscosity at a temperature where the adhesive film is adhered together with a conductor, in order that a part of the conductor is embedded in the adhesive layer. Also, after thermal curing, it is preferable that the thermosetting adhesive layer has a high viscosity in order that the conductor is stably fixed. Further, it is preferable that the adhesive film has excellent heat resistance so that semiconductor devices can be stably manufactured under high temperature conditions, because heat history near 200° C. is applied in the connecting step or the resin encapsulating step in the manufacture of semiconductor devices. From the above viewpoint, the thermosetting adhesive layer has an elastic modulus of preferably from $1 \times 10^2$ to $1 \times 10^4$ Pa, more preferably from $1 \times 10^2$ to $1 \times 10^3$ Pa, at 120° C. before curing. The thermosetting adhesive layer has an elastic modulus of 1 MPa or higher, more preferably from 1.5 to 100 MPa at 200° C. after curing.

In addition, it is preferable that the adhesive film of the present invention is easily stripped away from a semiconductor device without detaching a conductor from an encapsulation resin in the step (e) described below. From this viewpoint, in a case where a copper foil is used, for instance, as a conductor, the adhesive strength of the thermosetting adhesive layer to the copper foil is preferably from 1 to 20 N/20 mm, more preferably from 3 to 10 N/20 mm at 23° C. after curing.

The heat-resistant backing includes plastic backings such as polyesters, polyamides, polyphenylene sulfide, polyether imide, polyimides, and polyethylenenaphthalate, and porous backings thereof; paper backings such as glassine, bond paper, and Japanese paper; nonwoven backings such as cellulose, polyamides, polyesters, and aramid; metal film backings such as copper foil, aluminum foil, SUS foil, and nickel foil; and the like. Among them, the metal film backings are preferable from the viewpoint of ease of handling.

The thickness of the heat-resistant backing layer is preferably from about 10 to about 200 μm, more preferably from 25 to 100 μm, from the viewpoint of handleability.

The adhesive film of the present invention can be manufactured by a method comprising the steps of applying a solution prepared by dissolving the adhesive in an organic solvent to a heat-resistant backing, and drying the solution with heating; a method comprising the steps of applying a dispersion prepared by dispersing the adhesive in an aqueous medium to a heat-resistant backing, and drying the solution with heating; or the like. As the organic solvent for dissolving the adhesive, a ketone-based solvent such as methyl ethyl ketone is preferable from the viewpoint of solubility.

An adhesive film comprising plural layers of thermosetting adhesive layers can be manufactured according to a method comprising the step of forming adhesive layers on the heat-resistant backing layer one after another; a method comprising adhering an adhesive layer separately prepared in advance using a stripping laminate or the like to another adhesive layer or the heat-resistant backing layer; or appropriately combining these methods.

The shape of the adhesive film of the present invention is not particularly limited, and can take the form of sheet, tape or the like.

The adhesive film of the present invention can be applied to a method for manufacturing a semiconductor device comprising the steps (a) to (e) of:
(a) embedding at least a part of a conductor in the adhesive film to form a conductor adhered thereto;
(b) mounting a semiconductor chip on the conductor;
(c) connecting the semiconductor chip to the conductor;
(d) encapsulating the semiconductor chip with an encapsulation resin; and
(e) removing the adhesive film therefrom.

The method for manufacturing a semiconductor device is not particularly limited as long as the method comprises at least the steps (a) to (e) mentioned above. One embodiment thereof will be described hereinbelow, in accordance with FIG. 1.

The step (a) comprises the step of embedding at least a part of a conductor 4 in a thermosetting adhesive layer 1 of an adhesive film 3 of the present invention, to form a conductor 4 adhered to the adhesive film 3, which comprises the thermosetting adhesive layer 1 and a heat-resistant backing layer 2.

As the conductor to be used in the step (a), a lead frame can be used, for instance, in which openings are provided and electric conductive portions are arranged in a vertical-transverse matrix. The lead frame is made of a metal such as copper or an alloy containing copper, and has a terminal pattern of a CSP, of which electric contact portions may be coated (plated) with a material such as silver, nickel, palladium or gold in some cases. Usually, the thickness of the lead frame is preferably from about 5 to about 300 μm.

It is preferable that the lead frame is one in which each of the arrangement patterns of QFNs is systematically arranged, so that the lead frame can be easily divided in the subsequent dicing step. The form referred to as a matrix QFN or a MAP-QFN such as a form of the lead frame, on which conductive portions are arranged in a vertical-transverse matrix is one of the preferable form of lead frame in the present invention.

In the case of a general QFN, each of the substrate design on the lead frame comprises, for instance, terminal portions arranged around the opening, a die pad provided in the center of the opening, and a die bar making the die pad support the four corners of the opening.

The thickness of the conductor embedded in the adhesive film is preferably from about 5 to about 30% of the entire thickness of the conductor, from the viewpoint of increasing the mounting reliability of a semiconductor device having standoff.

The conductor formed by embedding a part thereof in the adhesive film can be fixed by thermally curing the thermosetting adhesive layer.

The step (b) comprises the step of mounting a semiconductor chip 5 on the conductor 4. The mounting step of the semiconductor chip 5 can be carried out by, for instance, bonding the side of the semiconductor chip 5 without forming any electrodes to the die pad side of the conductor 4, with an adhesive 6 or the like.

The step (c) comprises the step of connecting the semiconductor chip 5 the conductor 4. Specifically, this step comprises electrically connecting the conductive portions of the conductor 4 and the electrodes of the semiconductor chip 5 through wires 7 or the like.

The step (d) comprises the step of encapsulating the semiconductor chip 5 with an encapsulation resin 8. The method of encapsulating the semiconductor chip 5 with the encapsulation resin 8 is not particularly limited. For instance, the encapsulating step can be carried out using a mold in accordance with a usual transfer molding. Here, the molded resin may be subjected to post-curing with heating after transfer molding if desired. Here, the post-curing with heating may be carried out either before or after the next step (e).

The step (e) comprises the step of removing the adhesive film 3 therefrom. The method of removing the adhesive film 3 is not particularly limited, and a method such as peeling can be employed.

One embodiment of the semiconductor device manufactured through the steps described above is shown in FIG. 2. This semiconductor device has a so-called standoff wherein a part of the conductor 4 projects from the encapsulation resin 8.

EXAMPLES

Next, the present invention will be described more specifically by means of Examples, without intending to limit the scope or spirit of the present invention only to these Examples.

Example 1

Thirty parts by weight of acrylonitrile-butadiene rubber ("Nipol 1072J" commercially available from ZEON CORPORATION; content of acrylonitrile: 18% by weight), 65 parts by weight of bisphenol A epoxy resin ("Epikote 828" commercially available from Japan Epoxy Resins Co., Ltd.; epoxy equivalent: 190 g/eq.), and 5 parts by weight of imidazole ("C11Z" commercially available from Shikoku Kasei K. K.) were mixed together, and the components were dissolved in a methyl ethyl ketone solvent so as to give a solid content concentration of 35% by weight, to give an adhesive solution.

The resulting adhesive solution was applied onto a copper foil having a thickness of 100 μm as a heat-resistant backing, and then dried at 150° C. for 3 minutes, thereby forming a thermosetting adhesive layer having a thickness of 20 μm on the heat-resistant backing layer, to give an adhesive film.

The thermosetting adhesive layer of the obtained adhesive film had an elastic modulus of $5 \times 10^2$ Pa at 120° C. before curing, and had an elastic modulus of 1.5 MPa at 200° C. after curing. Also, the adhesive strength of the thermosetting adhesive layer to the copper foil was 8 N/20 mm at 23° C. after curing. Here, the elastic modulus and the adhesive strength were determined in accordance with the following methods.

[Determination Method for Elastic Modulus]
Evaluation equipment: Viscoelasticity Spectrometer (ARES) commercially available from Rheometric Scientific F. E. Ltd.
Programming rate: 5° C./min
Frequency: 1 Hz
Determination mode: shearing mode

[Determination Method for Adhesive Strength]
A copper foil having a thickness of 35 μm ("BHY-138T" commercially available from JAPAN ENERGY CORPORATION) was placed over the surface of the adhesive layer of the adhesive film having a width of 20 mm and a length of 50 mm, and laminated together under the conditions of 120° C., 0.5 MPa, and 0.5 m/min. Thereafter, the laminate was allowed to stand in a hot-air oven at 150° C. for 1 hour, and the adhesive film was then pulled in the direction of 180° at a rate of 300 mm/min in atmosphere conditions of 23° C. and 65% RH. The median thereof is defined as an adhesive strength.

Next, an outer side of a copper lead frame having a thickness of 200 μm in which LLGAs of which terminal portions were silver-plated (each having 9 pins per line×2 lines on each side) were arranged in 3 rows and 3 columns, was placed on the side of the thermosetting adhesive layer of the resulting adhesive film, and laminated with heating at 120° C., so that a part of the lead frame was embedded in the adhesive layer. Here, the thickness of the lead frame embedded in the adhesive layer was about 8 μm. Thereafter, the thermosetting adhesive layer was cured at 150° C. for 1 hour to fix the lead frame to the adhesive film.

A semiconductor chip was bonded to each of die pads of the lead frame by using an epoxy phenolic silver paste as an adhesive, and the adhesive was cured at 180° C. for 1 hour, thereby mounting the semiconductor chip on the die pad.

Next, the laminate of the adhesive film and the conductor was fixed to a heat block heated to 200° C. by carrying out vacuum suction on the side of the adhesive film, and further the peripheral portion of the laminate was pressed by a window damper to fix. Electrodes of the semiconductor chips were connected to conductive portions of the lead frame through 25 μm gold line ("GLD-25" commercially available from TANAKA PRECIOUS METALS) with a 115 kHz wire bonder (commercially available from SHINKAWA LTD.).

Further, those conductors were molded with an epoxy molding resin ("HC-300" commercially available from Nitto Denko Co., Ltd.) with a molding machine ("Model-Y-series" commercially available from TOWA) under the conditions of 175° C., a preheating time of 40 seconds, an injection time of 11.5 seconds, and a cure time of 120 seconds.

After the semiconductor chips were encapsulated with the epoxy resin, the adhesive film was stripped away. Further, post-curing with heating was carried out at 175° C. for 3 hours to sufficiently cure the resin. Thereafter, individual LLGA-type semiconductor devices were obtained by cutting with a dicer. In the LLGA-type semiconductor devices thus obtained, resin leakage was not observed, and each of the LLGA-type semiconductor devices had standoff having a height of about 8 μm at each of the lead terminal portions.

Comparative Example 1

An adhesive layer having a thickness of 5 μm was formed on a copper foil having a thickness of 100 μm as a heat-resistant backing using a silicone-based adhesive ("SD-4587L" commercially available from Dow Corning Toray Silicone Co., Ltd.), to give an adhesive film.

Semiconductor devices were manufactured in the same manner as in Example 1 using the obtained adhesive film. As a result, it was impossible to properly prevent resin leakage to the terminal portions so that about 60% or more of the terminals had flash. Also, substantially no standoff could be confirmed in the semiconductor devices.

The adhesive film of the present invention can be used in the manufacture of a semiconductor device.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An adhesive film for manufacturing a semiconductor device comprising a thermosetting adhesive layer having an elastic modulus of from $1 \times 10^2$ to $1 \times 10^5$ Pa at 120° C. before curing, and an elastic modulus of 1 MPa or more at 200° C. after curing and a heat-resistant backing layer, wherein said adhesive film can be used for manufacturing a semiconductor device comprising the steps of:
   (a) embedding at least a part of a conductor in the adhesive film to form a conductor adhered thereto;
   (b) mounting a semiconductor chip on the conductor;
   (c) connecting the semiconductor chip to the conductor;
   (d) encapsulating the semiconductor chip with an encapsulation resin to form an assembly comprising at least said adhesive film, said conductor, said semiconductor chip and said encapsulation resin; and
   (e) removing the adhesive film from said assembly.

2. The adhesive film according to claim 1, wherein the thermosetting adhesive layer has an adhesive strength to a copper foil of from 1 to 20 N/20 mm at 23° C. after curing.

3. The adhesive film according to claim 1, wherein the thermosetting adhesive layer comprises an adhesive comprising a rubber component and an epoxy resin component, wherein said rubber component is made of acrylonitrile-butadiene rubber or acrylic elastomer.

4. The adhesive film according to claim 3, wherein said rubber component is contained in the adhesive in an amount of from 5 to 40% by weight.

5. A method for manufacturing a semiconductor device, comprising the steps of:
   (a) embedding at least a part of a conductor in an adhesive film comprising a thermosetting adhesive layer having an elastic modulus of from $1 \times 10^2$ to $1 \times 10^4$ Pa at 120° C. before curing, and an elastic modulus of 1 MPa or more at 200° C. after curing and a heat-resistant backing layer to form a conductor adhered thereto;
   (b) mounting a semiconductor chip on the conductor;
   (c) connecting the semiconductor chip to the conductor;
   (d) encapsulating the semiconductor chip with an encapsulation resin to form an assembly comprising at least said adhesive film, said conductor, said semiconductor chip and said encapsulation resin; and
   (e) removing the adhesive film from said assembly.

6. The method of claim 5, and further comprising the step of post-curing said encapsulation resin either before or after step (c).

7. The method of claim 5, wherein the thermosetting adhesive layer has an adhesive strength to a copper foil of from 1 to 20 N/20 mm at 23° C. after curing.

8. The method of claim 5, wherein the thermosetting adhesive layer comprises an adhesive comprising a rubber component and an epoxy resin component, wherein said rubber component is made of acrylonitrile-butadiene rubber or acrylic elastomer.

9. The method of claim 8, wherein said rubber component is contained in the adhesive in an amount of from 5 to 40% by weight.

* * * * *